United States Patent
Kim et al.

(10) Patent No.: US 10,825,514 B2
(45) Date of Patent: *Nov. 3, 2020

(54) BIPOLAR SWITCHING OPERATION OF CONFINED PHASE CHANGE MEMORY FOR A MULTI-LEVEL CELL MEMORY

(71) Applicant: International Business Machines Corporation, Armonk, NY (US)

(72) Inventors: Wanki Kim, Chappaqua, NY (US); Matthew Joseph BrightSky, Pound Ridge, NY (US); Yu Zhu, Rye Brook, NY (US); Yujun Xie, New Haven, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/958,833

(22) Filed: Apr. 20, 2018

(65) Prior Publication Data

US 2019/0325954 A1    Oct. 24, 2019

(51) Int. Cl.
  *G11C 13/00* (2006.01)
  *H01L 45/00* (2006.01)
  *G11C 11/56* (2006.01)

(52) U.S. Cl.
  CPC ...... *G11C 13/0004* (2013.01); *G11C 11/5678* (2013.01); *G11C 13/0069* (2013.01); *H01L 45/06* (2013.01); *H01L 45/1253* (2013.01); *H01L 45/144* (2013.01)

(58) Field of Classification Search
  CPC ............ G11C 13/0004; G11C 13/0069; G11C 11/5678; H01L 45/06; H01L 45/144

USPC ......................... 365/148, 145, 163, 100, 173
See application file for complete search history.

(56) References Cited

U.S. PATENT DOCUMENTS

| | | |
|---|---|---|
| 7,269,080 B2 | 9/2007 | Bedeschi et al. |
| 8,017,433 B2 | 9/2011 | Lam et al. |
| 8,111,541 B2 | 2/2012 | Lai et al. |
| 8,187,918 B2 | 5/2012 | Oh et al. |
| 8,228,722 B2 | 7/2012 | Savransky et al. |
| 8,363,446 B2 | 1/2013 | Czubatyj et al. |

(Continued)

OTHER PUBLICATIONS

Lee et al., "Bias Polarity Dependence of a Phase Change Memory With a Ge-Doped SbTe: A Method for Multilevel Programing," Applied Physics Letters, 2008, vol. 92, American Institute of Physics, 4 pages.

(Continued)

*Primary Examiner* — Connie C Yoha
(74) *Attorney, Agent, or Firm* — Amin, Turocy & Watson, LLP

(57) ABSTRACT

The embodiments described herein facilitate performing bipolar switching of a confined phase change memory (PCM) with a metallic liner, wherein the phase change memory and the metallic liner are located between a first electrode and a second electrode of a semiconductor structure, wherein a first voltage is applied to the first electrode while the second electrode is grounded, and wherein a second voltage is applied to the second electrode while the first electrode is grounded. The bipolar switching can be performed so as to produce a plurality of resistance states. Thus, this confined PCM can be utilized as a multi-level cell (MLC) memory.

19 Claims, 12 Drawing Sheets

(56) References Cited

U.S. PATENT DOCUMENTS

| | | | |
|---|---|---|---|
| 8,809,828 B2 | 8/2014 | Breitwisch et al. | |
| 8,895,953 B1 | 11/2014 | Shields et al. | |
| 8,921,820 B2 | 12/2014 | BrightSky et al. | |
| 8,946,073 B2 | 2/2015 | BrightSky et al. | |
| 9,166,161 B2 | 10/2015 | BrightSky et al. | |
| 9,224,471 B2 | 12/2015 | Chen | |
| 9,397,143 B2 | 7/2016 | Rocklein et al. | |
| 9,559,107 B2 | 1/2017 | Briggs et al. | |
| 10,141,503 B1* | 11/2018 | BrightSky | H01L 45/1246 |
| 10,319,440 B1* | 6/2019 | Kim | H01L 45/1641 |
| 2008/0135824 A1* | 6/2008 | Lai | G11C 11/5664 257/2 |
| 2008/0232160 A1 | 9/2008 | Gopalakrishnan | |
| 2008/0304307 A1 | 12/2008 | Gopalakrishnan | |
| 2010/0103718 A1 | 4/2010 | Asao et al. | |
| 2010/0238711 A1 | 9/2010 | Asao | |
| 2011/0136315 A1 | 6/2011 | Kuo et al. | |
| 2011/0141801 A1 | 6/2011 | Gopalakrishnan | |
| 2011/0317472 A1 | 12/2011 | Awaya et al. | |
| 2012/0008367 A1 | 1/2012 | Kajiyama | |
| 2012/0320658 A1 | 12/2012 | Wang et al. | |
| 2013/0099188 A1 | 4/2013 | Kim et al. | |
| 2014/0036570 A1 | 2/2014 | Lee et al. | |
| 2014/0063898 A1* | 3/2014 | Fantini | G11C 11/56 365/148 |
| 2014/0197368 A1* | 7/2014 | Yoneda | H01L 45/08 257/2 |
| 2015/0144859 A1* | 5/2015 | Chen | H01L 45/1253 257/4 |
| 2015/0179706 A1 | 6/2015 | Rocklein et al. | |
| 2016/0111153 A1* | 4/2016 | Tada | G11C 13/0011 365/148 |
| 2016/0343721 A1 | 11/2016 | Briggs et al. | |
| 2016/0343723 A1 | 11/2016 | Briggs et al. | |
| 2019/0304541 A1* | 10/2019 | Kim | G11C 13/0069 365/148 |

OTHER PUBLICATIONS

"Cell Design for MLC Capability Using Thermoelectrics", IPCOM000238358D, Aug. 20, 2014, 6 pages.

Kim, et al., "A Phase Change Memory Cell with Metallic Surfactant Layer as a Resistance Drift Stabilizer," IEDM, 2013, IEEE, 4 pages.

Brightsky, et al., "Crystalline-as-Deposited ALD Phase Change Material Confined PCM Cell for High Density Storage Class Memory," IEDM, 2015, IEEE, 4 pages.

Kim et al., "Optimization of Programming Current on Endurance of Phase Change Memory," VLSI-TSA, IEEE, 2012, 2 pages.

Chen et al., "Endurance Improvement of Ge2Sb2Te5-Based Phase Change Memory", IEEE International Memory Norkshop (IMW), 2009, 2 pages.

Kim et al., "ALD-based Confined PCM with a Metallic Liner toward Unlimited Endurance", IEEE International Electron Devices Meeting (IEDM), 2016, 4 pages.

List of IBM Patents or Applications Treated as Related.

Notice of Allowance for U.S. Appl. No. 16/290,353 dated Feb. 21, 2020, 26 pages.

Notice of Allowance for U.S. Appl. No. 15/937,176 dated Jan. 29, 2019, 26 pages.

* cited by examiner

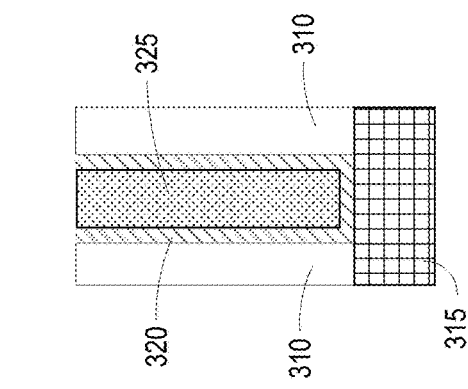
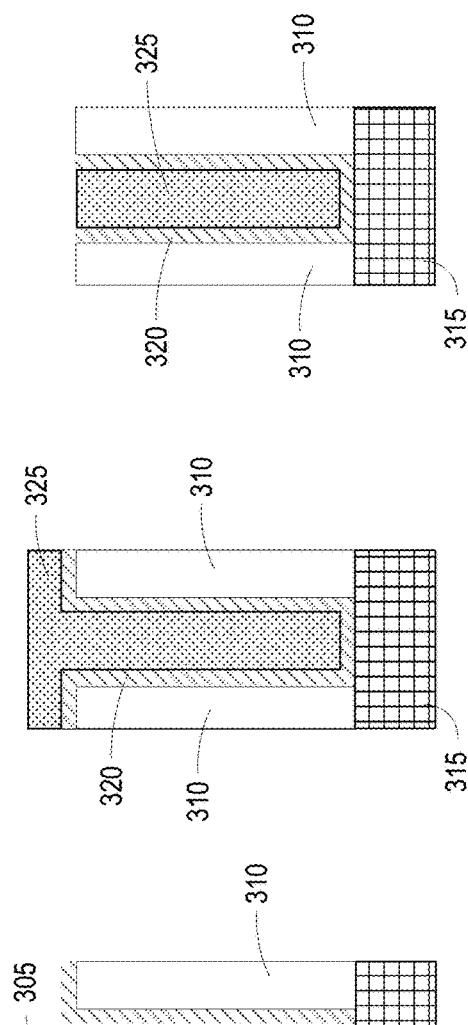
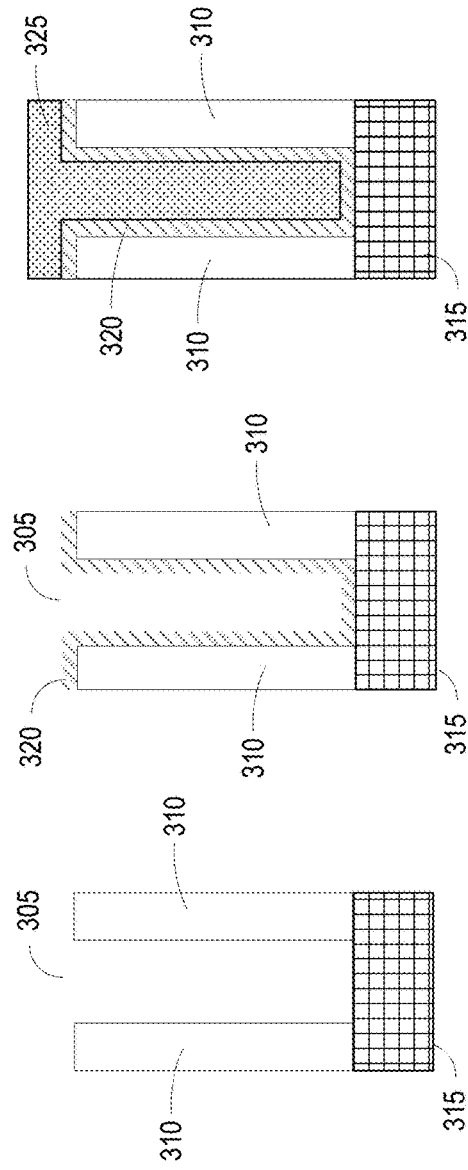
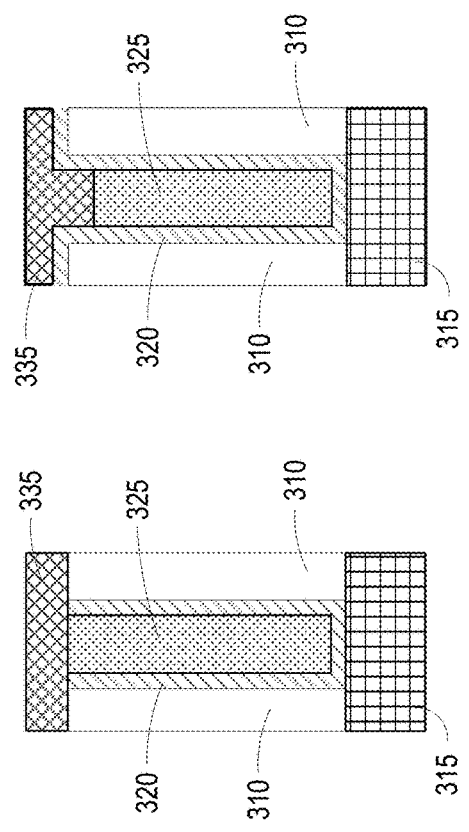
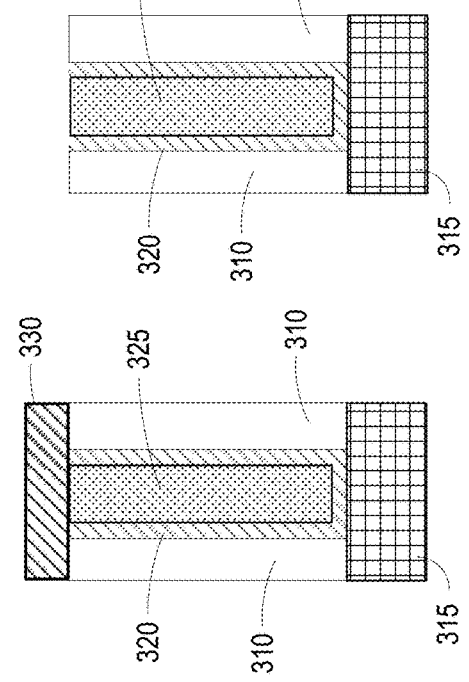
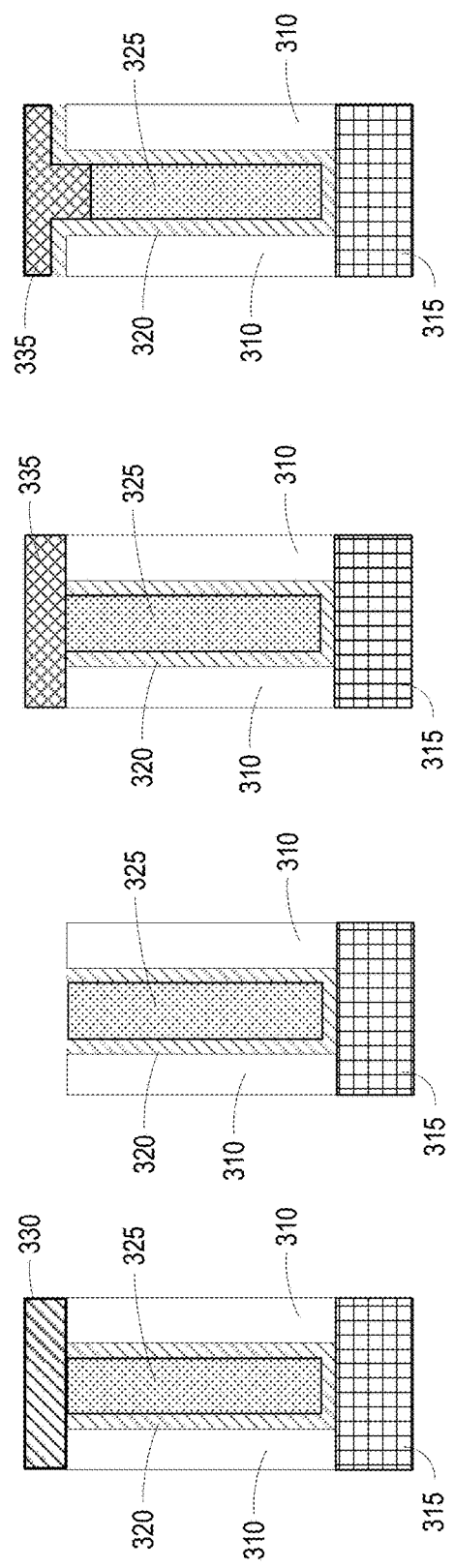
FIG. 3A   FIG. 3B   FIG. 3C   FIG. 3D
FIG. 3E   FIG. 3F   FIG. 3G   FIG. 3H

US 10,825,514 B2

BIPOLAR SWITCHING OPERATION OF CONFINED PHASE CHANGE MEMORY FOR A MULTI-LEVEL CELL MEMORY

BACKGROUND

One or more embodiments of the subject invention relate to semiconductor structures, and more specifically, to a bipolar switching operation of a confined phase change memory with a metallic liner utilized as a multi-level cell memory.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to one or more example embodiments described herein, a method can comprise applying a first voltage to a first electrode (e.g., top electrode) of a semiconductor structure comprising a phase change memory (e.g., phase change memory material, e.g., germanium-antimony-tellurium (GST)) having a metallic liner (e.g., comprising any metal, e.g., comprising a metal nitride) contacting the phase change memory while a second electrode (e.g., bottom electrode) of the semiconductor structure is grounded, wherein the phase change memory and the metallic liner are located between the first electrode and the second electrode. The method can further comprise applying a second voltage to the second electrode while the first electrode is grounded. The method can further comprise producing a plurality of resistance states by the applying the first voltage and the applying the second voltage. The first voltage and the second voltage can be of the same polarity (e.g., positive). For example, for positive-biased programming, a positive voltage can be applied to the first electrode while the second electrode is grounded, and for negative-biased programming, a positive voltage can be applied to the bottom electrode while the top electrode is grounded. A first amplitude of the first voltage can be different from the second amplitude of the second voltage.

According to one or more example embodiments described herein, another method can comprise applying a first charge to a first electrode (e.g., top electrode) of a semiconductor structure while grounding a second electrode (e.g., bottom electrode) of the semiconductor structure, wherein the semiconductor structure comprises a phase change memory material (e.g., phase change memory material, e.g., germanium-antimony-tellurium (GST)) with a metallic liner (e.g., comprising any metal, e.g., comprising a metal nitride). The method can further comprise applying a second charge to a second electrode of the semiconductor structure, while grounding the first electrode, wherein the applying the first charge and the applying the second charge result in a plurality of resistance states. The first charge and the second charge can be of the same polarity (e.g., positive).

According to one or more example embodiments described herein, another method can comprise: performing a positive biased programming operation, comprising applying a first positive voltage to a first electrode (e.g., top electrode) of a semiconductor structure while a second electrode (e.g., bottom electrode) of the semiconductor structure is grounded, wherein the semiconductor structure comprises a phase change memory (e.g., phase change memory material, e.g., germanium-antimony-tellurium (GST)) lined with a metallic liner (e.g., comprising any metal, e.g., comprising a metal nitride). The method further comprises, performing a negative biased programming operation, comprising applying a second positive voltage to the second electrode while the first electrode is grounded, wherein the performing the positive biased programming operation and the performing the negative biased programming operation results in a plurality of resistance states, allowing the phase change memory to be utilized as a multi-level cell (MLC) memory.

BRIEF DESCRIPTION OF THE DRAWINGS

FIGS. 3A-3H depict cross sectional views of a semiconductor structure at various stages of fabrication, so as to illustrate a method to fabricate example embodiments of a semiconductor structure that can be used to perform bipolar switching operations in accordance with example embodiments of the present invention.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Phase change memory (PCM) is one of the promising emerging memory technologies that is expected to meet the fast-growing demand for large capacity memory. In Multi-level cell (MLC) PCM, multiple bits are stored in a single cell. Storage of multiple bits per cell is one of the most desirable features of nonvolatile memory technologies because MLC offers high density with low per-byte fabrication costs.

One of the main challenges of MLC technology is fitting more cell states (4 in the case of 2 bits per cell), along with distribution spreads (variance of resistance for each state) due to process and design variations within a limited window. If the distribution of each resistance for each state is not tight, overlap of neighboring states can occur, resulting in read failure of the MLC.

Typical PCM also suffers from resistance drift phenomenon. This time-dependent resistance drift is one of the main challenges for realizing robust MLC PCM.

In accordance with one or more embodiments described herein, there is provided herein a bipolar switching operation of confined PCM for MLC. The confined PCM with metallic liner can mitigate resistance drift efficiently. In addition, the negative-bias switching with confined PCM can result in a resistance value that is between set resistance and reset resistance of positive-bias programming. Therefore, a bipolar switching operation with a confined PCM can generate stable intermediate states for MLC PCM.

Figure 1:
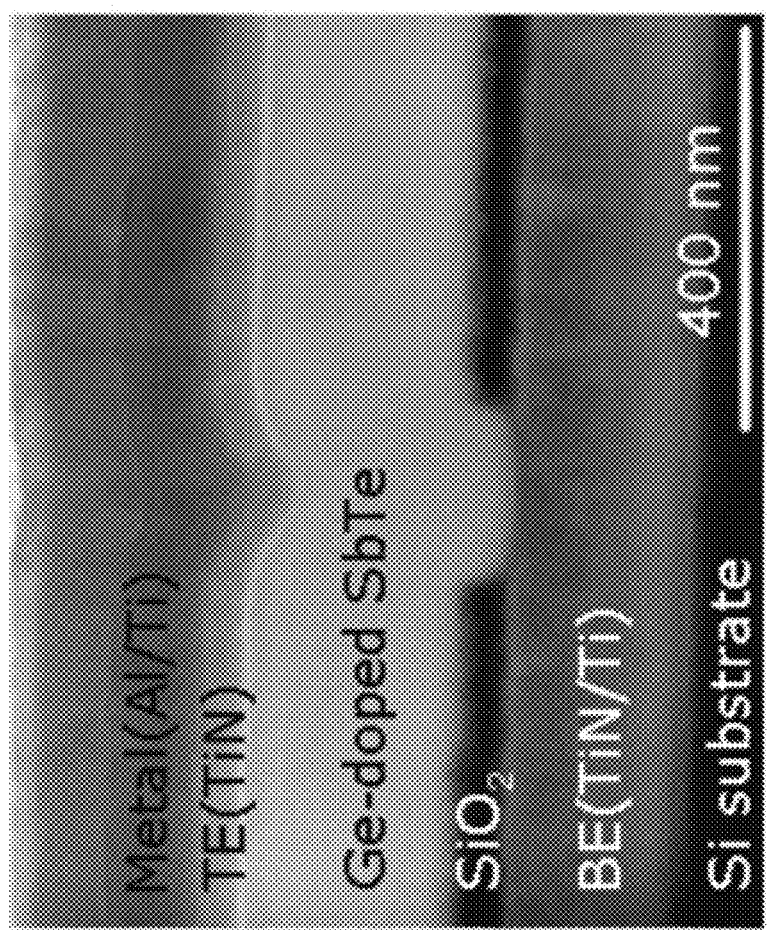
FIG. 1 depicts a scanning electron micrography (SEM) photograph showing a semiconductor structure having a phase change memory without a metallic liner.

FIG. 1 depicts a scanning electron micrography (SEM) photograph showing a semiconductor structure/device having a phase change memory (e.g., phase change memory material) without a metallic liner. In some embodiments, the phase change memory material is germanium-antimony-tellurium (GeSbTe), which is also referred to herein as (GST). The structure comprises a silicon (Si) substrate, a bottom electrode (BE) and top electrode (TE) comprising titanium nitride (TiN) and titanium (Ti) films, silicon dioxide (SiO2), GST, and a metal aluminum(Al)/titanium(Ti) layer on top.

Figure 2:
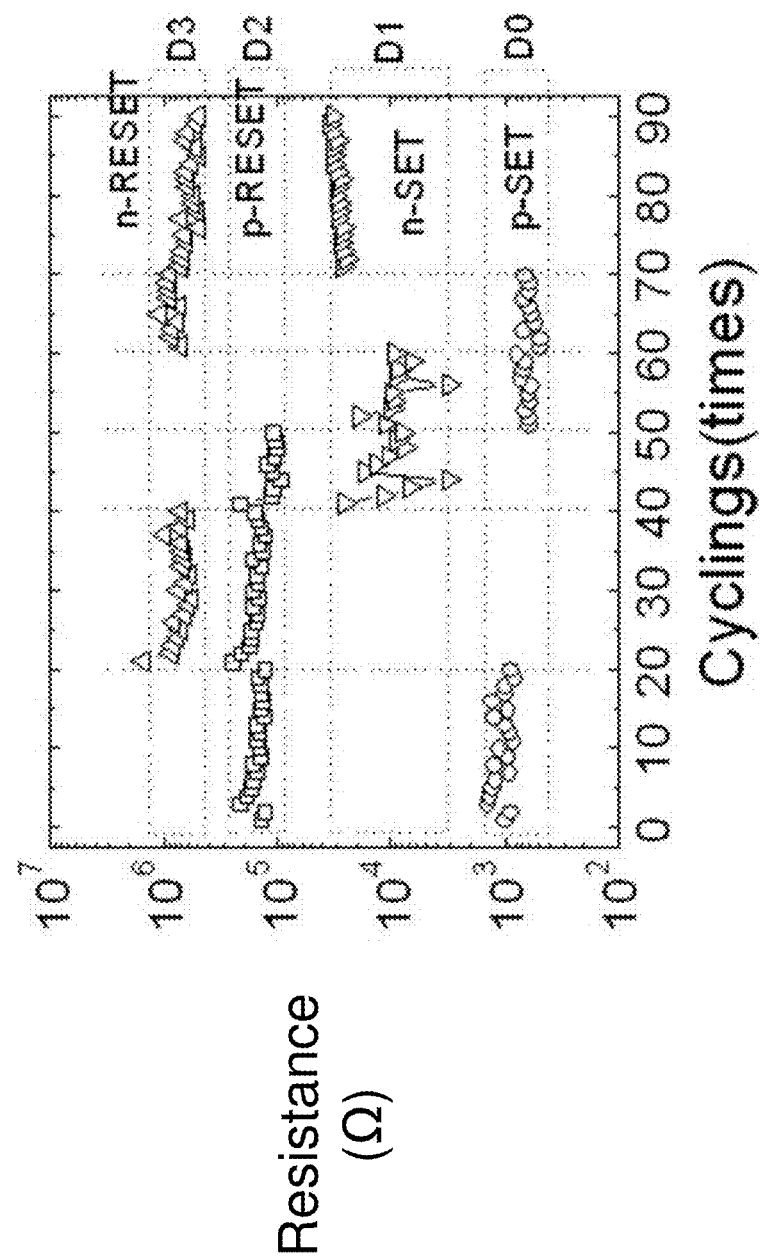
FIG. 2 illustrates a graph showing variance resistance states associated with the semiconductor structure illustrated in FIG. 1.

FIG. 2 illustrates a graph showing variance resistance states associated with the semiconductor structure/device illustrated in FIG. 1. For example, FIG. 2 depicts a graph showing the reproducibility of all possible switching modes between four levels. The semiconductor structure/device shows higher resistance, both at the SET state and the RESET state. The device may be capable of a 2-bit operation based on the four distinguishable resistance levels. Except for relatively large variations in n-set resistance, the resistance levels are sufficiently distinguishable and reproducible to be used for a multilevel storage. However, only the choice of positive polarity (positive on large-area electrode) can be used to produce low SET resistances, while negative polarity (positive on small-area electrode) is associated with hard-to-SET operation (high SET resistance). Further, the PCM pore structure of the device does not have a metallic liner. So, the PCM device of FIG. 2 suffers from time-dependent resistance drift phenomenon.

FIGS. 3A-3H depict cross sectional views of a semiconductor structure (e.g., a multi-level cell (MLC)) at various stages of fabrication, so as to illustrate a method to fabricate example embodiments of a semiconductor structure that can be used to perform bipolar switching operations in accordance with example embodiments of the present invention. In example embodiments, the semiconductor structure can comprise a confined PCM (e.g., GST) lined with a metallic liner (e.g., metal nitride liner).

In FIG. 3A, a pore 305 is formed from a dielectric layer 310, which resides on a bottom electrode 315 (which can be composed of a metal or other conductive material such as, but not limited to, titanium nitride (TiN)). The dielectric layer 310 can comprise any suitable dielectric material, such as silicon oxide (SiO2), silicon nitride (SiN), silicoboron carbonitride (SiBCN), silicon oxycarbonitride (SiOCN), silicon carbon nitride (SiCN), silicon oxycarbide (SiOC), silicon oxynitride (SiON), etc., or any suitable combination of these materials.

In FIG. 3B, a pore 305 is filled with a thin, metallic liner 320 (e.g., comprising any metal (e.g., metal nitride)), also referred to as a metallic surfactant layer. The metallic liner can be deposited to line the pore using, for example, atomic layer deposition (ALD).

Moving to FIG. 3C, the pore 305 is then filled with a phase change memory 325 (also referred to as "phase change memory material" or "phase change material"), such as GST. The fill of the pore 305 can be accomplished using, for example, any tool that allows for no vacuum break between the metallic liner and phase change memory 325 (e.g., an ALD tool).

In FIG. 3D, any phase change memory 325 deposited in excess on the surface of the structure is etched or polished. The metallic liner 320 that is on the surface can also be removed (e.g., etched or polished via chemical mechanical planarization (CMP)).

In FIG. 3E, the structure is capped with a cap 330, for example using silicon nitride (SiN), or some other nitride, which can serve as a protective layer over the phase change memory 325. After capping, a high temperature crystallization anneal (also referred to as "densification") can be performed. The anneal can help to reduce the number of voids within the phase change memory 325, facilitating endurance of the structure over numerous cycles (e.g., switching without degradation after many SET-RESET programming cycles).

In FIG. 3F, the cap 330 can be removed. In FIG. 3G, a top electrode 335, which can be made of a metal or other conductive material (e.g., titanium nitride (TiN)), can be formed over the structure, using for example, a top electrode 335 metal deposition process.

FIG. 3H shows an alternative example embodiment of the structure in which the top portion of the metallic liner 320 was not etched (as it was with respect to FIG. 3D).

Figure 4:
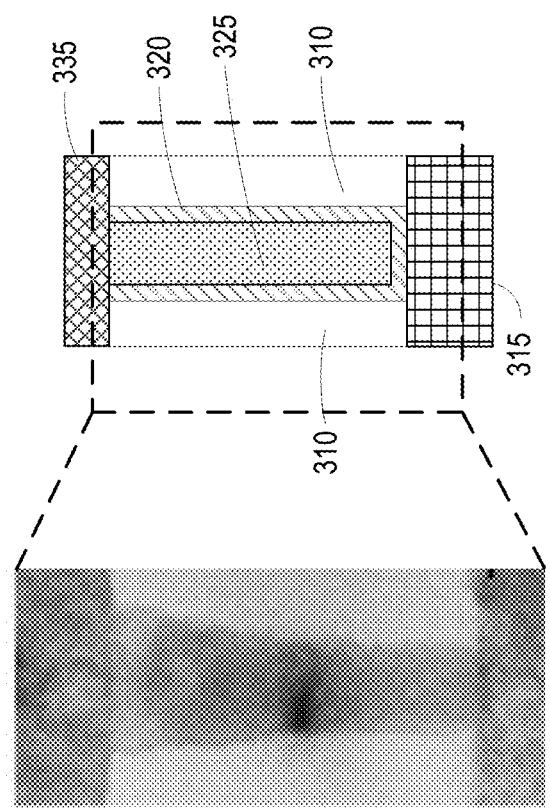
FIG. 4 depicts a photograph of a cross-sectional view of a semiconductor structure that can be used to perform bipolar switching operations in accordance with example embodiments of the present invention.

FIG. 4 depicts a photograph of a cross-sectional view of a semiconductor structure that can be used to perform bipolar switching operations in accordance with example embodiments of the present invention. For example, FIG. 4 shows a transmission electron microscope (TEM) image of the structure, and a corresponding cross-sectional diagram of the structure. The phase change memory 325, which is confined with a metallic liner 320, is located between the top electrode 335 and bottom electrode 315. The phase change memory 325 is surrounded by continuous, thin, metallic liner 320, and confined inside a pore. With an appropriate resistivity, the metallic liner 320 can provide an alternative conductive path when the direct current path across the phase change memory 325 becomes blocked. This metallic liner 320 can thus mitigate resistance drift, as shown in FIG. 5.

Figure 5:
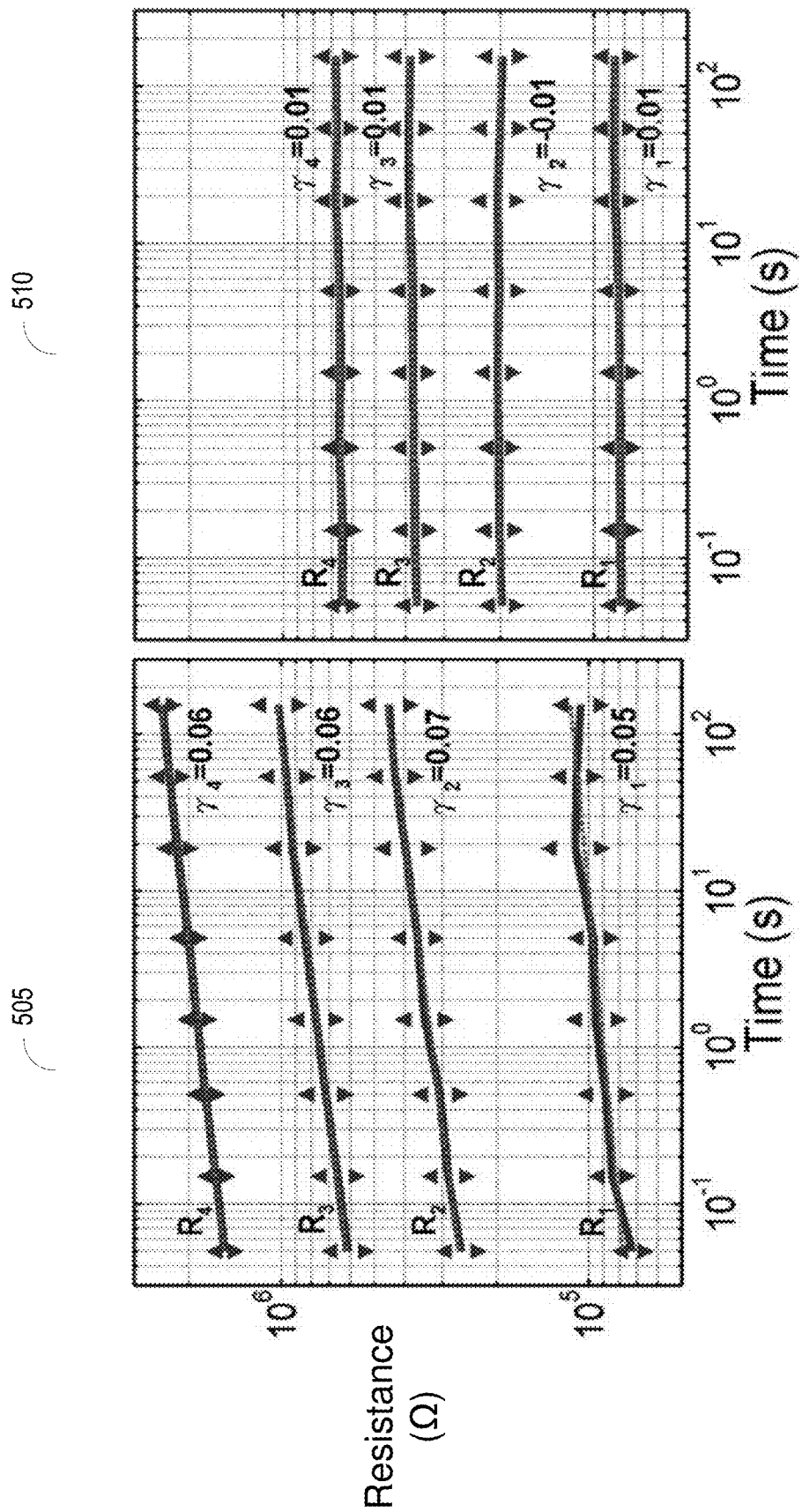
FIG. 5 shows a graph related to a semiconductor structure in which the phase change memory does not have a metallic liner versus a graph related to a semiconductor structure having a phase change memory lined with a metallic liner.

FIG. 5 shows a graph related to a semiconductor structure in which the phase change memory does not have a metallic liner versus a graph related to a semiconductor structure having a phase change memory lined with a metallic liner. For example, in FIG. 5, graph 505 shows a resistance versus time plot for a structure in which the phase change memory 325 does not have a metallic liner 320. As can be seen, the resistance begins to drift over time, until the resistance of each state begins to bleed upward, eventually overlapping into a neighboring state, which can lead to read failure. As mentioned, the metallic liner 320 can provide an alternative conductive path when the direct current path across the phase change memory 325 is blocked. This behavior acts to suppress resistance variation caused by amorphous phase time-dependent drift. As shown in graph 510, contrasted from a semiconductor structure without a metallic liner, in case of the semiconductor structure with the metallic liner 320, each resistance level is stabilized, with a 6× reduction in drift coefficient (indicated with the symbol y in FIG. 5). The triangles of each graph also indicate that the deviation of each resistance level is also reduced when the metallic liner 320 is present, compared to when the metallic liner 320 is not implemented.

Figure 6:
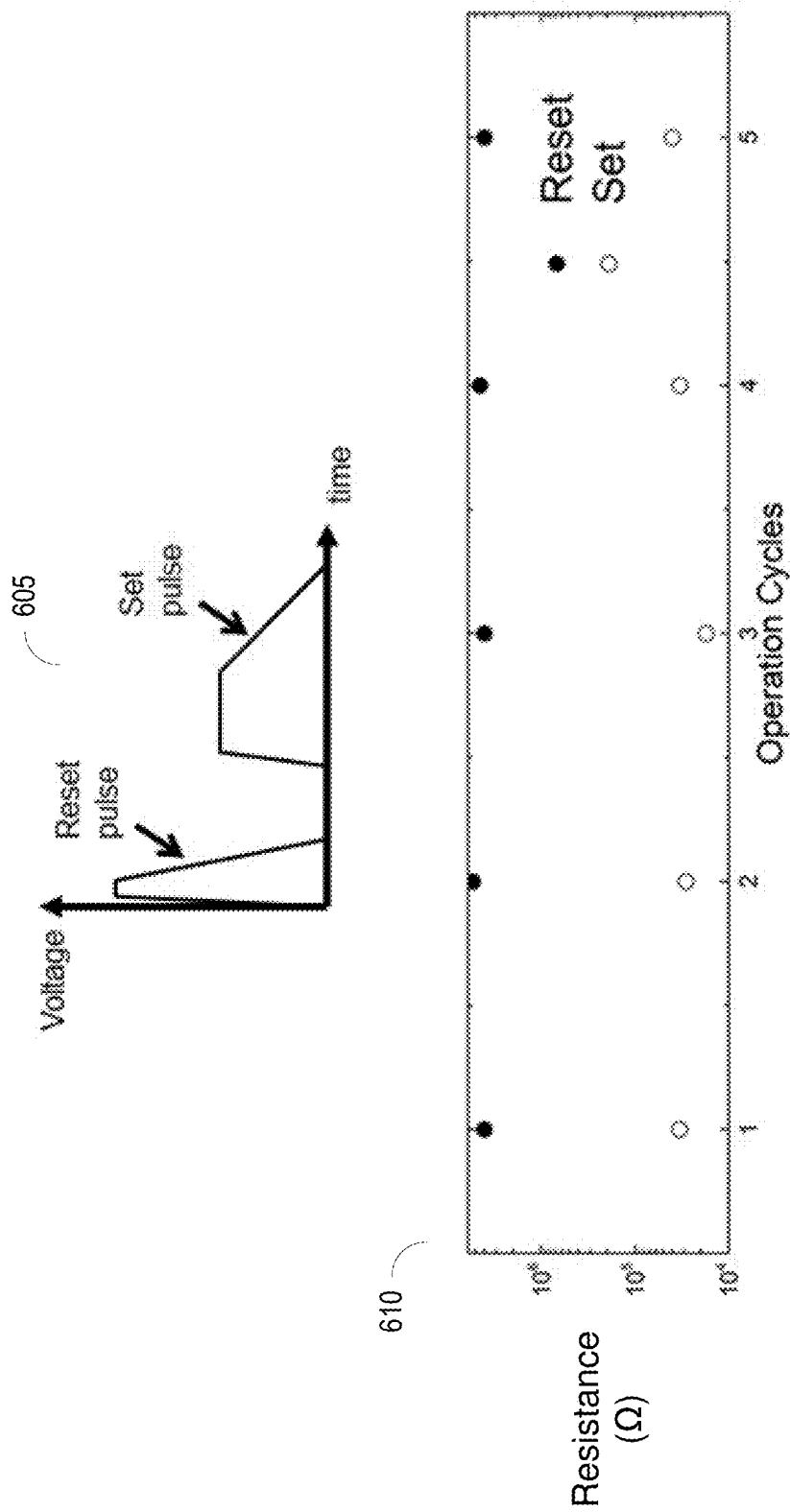
FIG. 6 shows graphs related to positive-bias programming of a semiconductor structure having a phase change memory with a metallic liner in accordance with one or more embodiments described herein.
Figure 7:
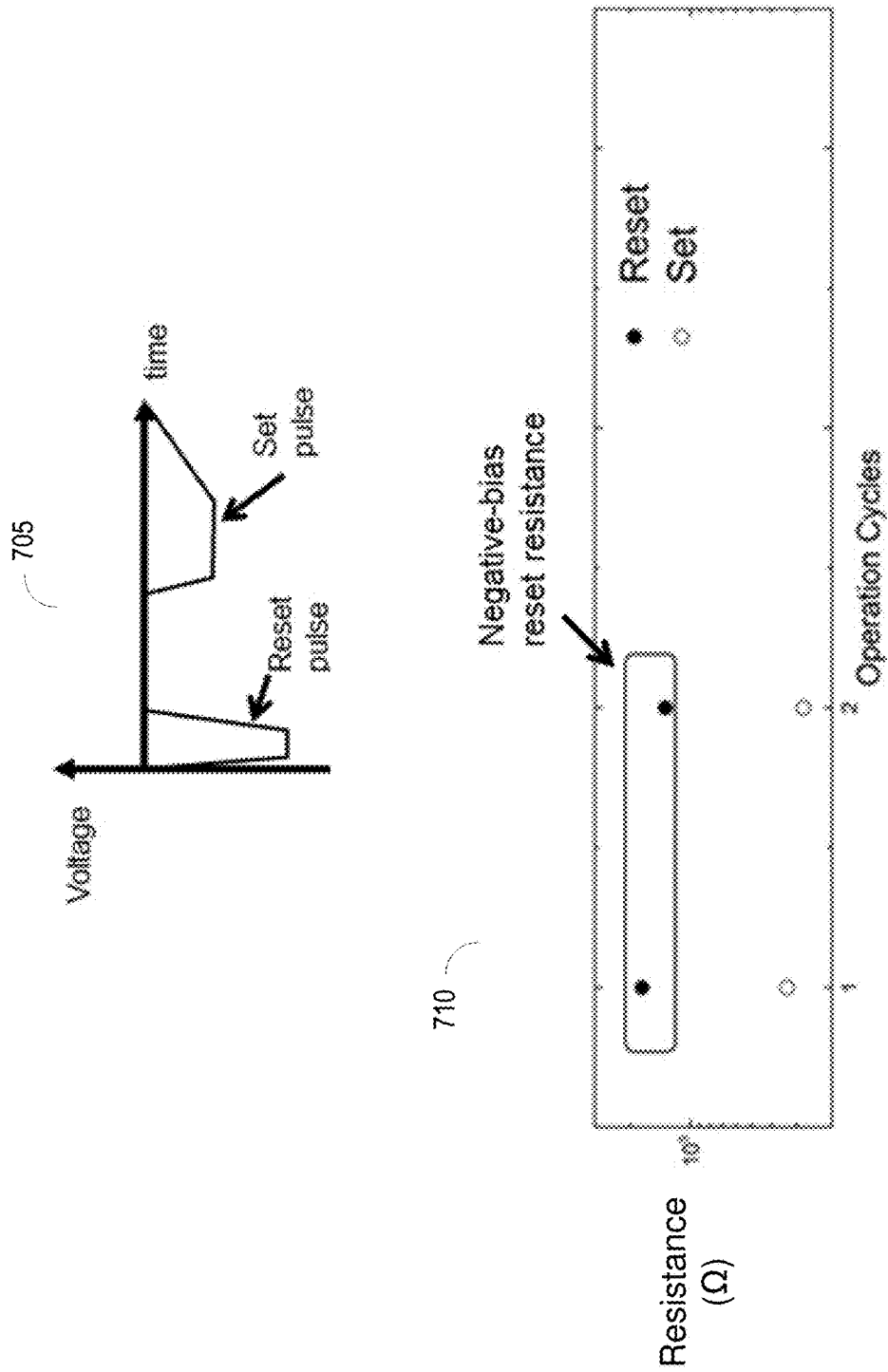
FIG. 7 shows graphs related to negative-bias programming of a semiconductor structure having a phase change memory with a metallic liner in accordance with one or more embodiments described herein.

FIG. 6 shows graphs related to positive-bias programming of a semiconductor structure having a phase change memory with a metallic liner in accordance with one or more embodiments described herein. FIG. 7 shows graphs related to negative-bias programming of a semiconductor structure having a phase change memory with a metallic liner in accordance with one or more embodiments described herein.

FIGS. 6-7 indicate information that can be employed to provide methods to perform bipolar switching operation of the MLC comprising a phase change memory 325 with a metallic liner 320, wherein the phase change memory 325 with metallic liner are confined within a pore 305 (as described above with respect to FIGS. 3-5). Referring to FIG. 6, for positive-bias programming (which can also be referred to as "forward-bias programming," wherein the voltage of the top electrode minus the voltage of the bottom electrode is positive), a positive voltage (e.g., a positive charge) can be applied to the top electrode while the bottom electrode is grounded. Alternatively, a negative voltage can be applied to the bottom electrode, while the top electrode is grounded. As can be seen, in positive-bias programming, a reset pulse (e.g., pulse of voltage, pulse of charge) followed by a set pulse as depicted in graph 605, can result in the cell resistance states shown in graph 610, with reset state resistances clearly on a resistance level above the set state resistances. The magnitude (e.g., amplitude) of the reset pulse can be greater than that of the set pulse, and the duration of the reset pulse can be shorter than the duration of the set pulse, with a resting period of no charge between each pulse.

Referring now to FIG. 7, for negative-bias programming (which can also be referred to as "reverse-bias programming," wherein the voltage of the top electrode minus the voltage of the bottom electrode is negative), a negative voltage (e.g., negative charge) can be applied to the top electrode while the bottom electrode is grounded. Alternatively, a positive voltage can be applied to the bottom electrode while the top electrode is grounded. Similar to the positive-bias programming, a reset pulse followed by a set pulse, can result in the cell resistance states shown in graph 705, with reset state and set state resistances on separate resistance levels. The reset pulse and the set pulse can both be of a negative charge. The magnitude (e.g., amplitude) of the reset pulse can be greater than that of the set pulse, and the duration of the reset pulse can be shorter than the duration of the set pulse, with a resting period of no charge between each pulse.

As can be seen from FIGS. 6 and 7, the set resistance is similar for both positive-bias programming and negative-bias programming. However, the reset resistance of negative-bias programming is between the set resistance and the reset resistance of positive-bias programming. Thus, negative-bias reset programming can make an intermediate state between the set resistance and reset resistance of positive-bias programming.

In non-limiting example embodiments, a computing device (or system) (e.g., computer 3312) is provided comprising one or more processors and one or more memories that stores executable instructions that, when executed by the one or more processors, can facilitate performance of the operations as described herein, including the non-limiting methods as illustrated in FIGS. 8-11 below. As a non-limiting example, the one or more processors can facilitate performance of the methods by directing or controlling one or more equipment operable to perform chip assembly, and the positive and negative biasing operations described.

Figure 8:
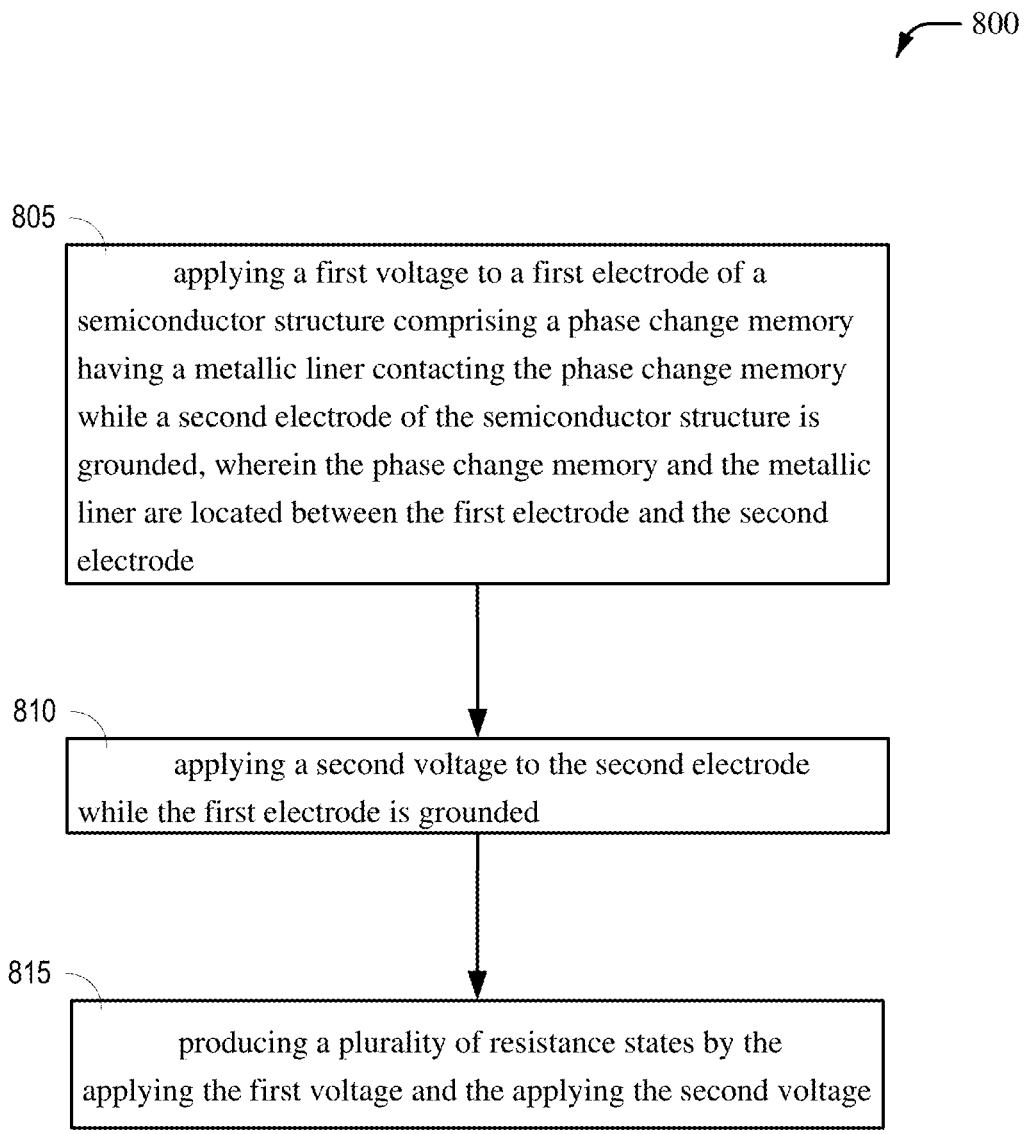
FIG. 8 illustrates a flow diagram of an example, non-limiting method to perform a bipolar switching of semiconductor structure having a phase change memory with a metallic liner in accordance with one or more embodiments described herein.

FIG. 8 illustrates a flow diagram 800 depicting an example non-limiting method (e.g., operations) to perform a bipolar switching of a semiconductor structure having a phase change memory (e.g., phase change memory 325) with a metallic liner (e.g., metallic liner 320) in accordance with one or more embodiments described herein. The example method can comprise, at 805, applying a first voltage to a first electrode (top electrode 335) of a semiconductor structure comprising a phase change memory (e.g., phase change memory 325) having a metallic liner (e.g., metallic liner 320) contacting the phase change memory while a second electrode (e.g. bottom electrode 315) of the semiconductor structure is grounded, wherein the phase change memory and the metallic liner are located between the first electrode and the second electrode. The method at 810 can further comprise applying a second voltage to the second electrode while the first electrode is grounded. The method at 820 can further comprise producing a plurality of resistance states by the applying the first voltage and the applying the second voltage. The performing the bipolar switching produces a plurality of resistance states, making the phase change memory suitable for utilization as a multi-level cell (MLC) memory.

Still referring to FIG. 8, the phase change memory can comprise any type of material suitable for a phase change memory, including, for example, germanium-antimony-tellurium (GST). The metallic liner can comprise any metal, and can also comprise a metal nitride. A dielectric material (e.g., dielectric layer 310) can surround the metallic liner. The first voltage and the second voltage can both be of the same polarity. For example, they can both be of a positive polarity (e.g., positive charge). Further, the first voltage can have a first amplitude, and the second voltage can have a second amplitude. The first amplitude can be different from the second amplitude.

As mentioned, the bipolar switching can be performed so as to produce a plurality of resistance states. The semiconductor structure can be a first semiconductor structure, the phase change memory can be a first phase change memory, and the plurality of resistance states can be a first plurality of resistance states. A first resistance drift associated with one of the first plurality of resistance states is less than a second resistance drift associated with a second plurality of resistance states associated with a second semiconductor structure having a second phase change memory without the metallic liner (e.g., the second semiconductor structure can be as depicted in FIG. 1). This was also illustrated with respect to FIG. 5. Additionally, a first drift coefficient associated with one of the first plurality of resistance states is less than a second drift coefficient associated a second plurality of resistance states associated with the second semiconductor structure (also illustrated with respect to FIG. 5).

Figure 9:
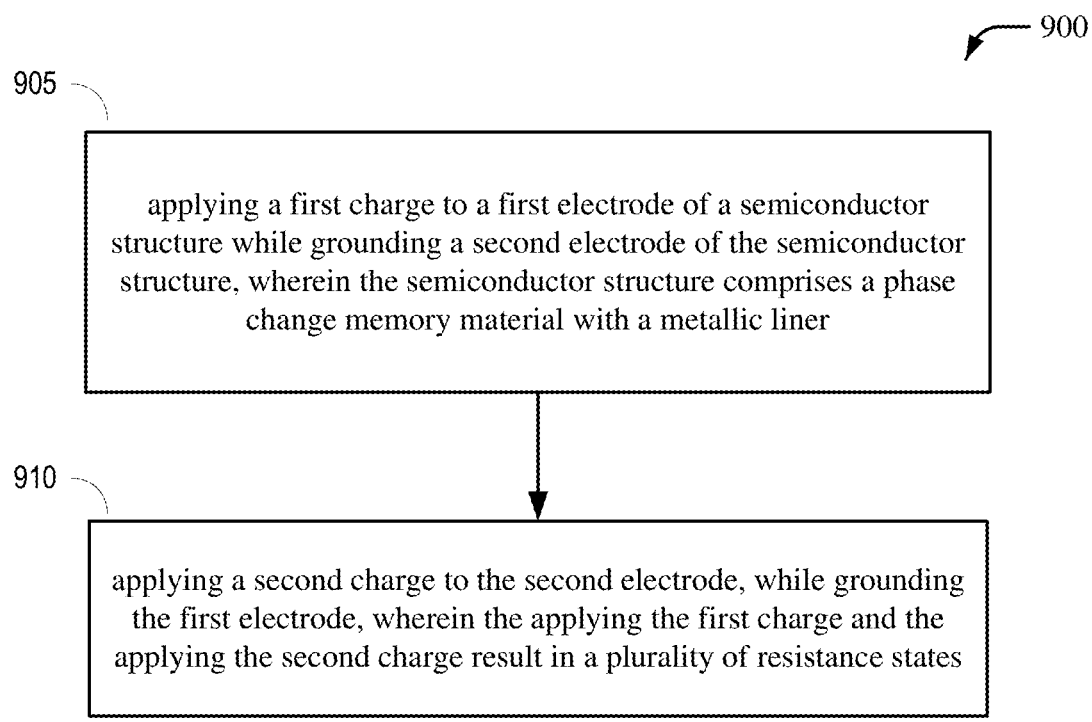
FIG. 9 illustrates a flow diagram of another example, non-limiting method to perform a bipolar switching of semiconductor structure having a phase change memory with a metallic liner in accordance with one or more embodiments described herein.

Moving on to FIG. 9, another flow diagram 900 depicts an example non-limiting method (e.g., operations) to perform bipolar switching in accordance with one or more embodiments described herein. The method can further comprise, at 905, applying a first charge to a first electrode (e.g., top electrode 335) of a semiconductor structure while grounding a second electrode (e.g., bottom electrode 315) of the semiconductor structure, wherein the semiconductor structure comprises a phase change memory material (e.g., phase change memory 325) with a metallic liner (e.g., metallic liner 320). The method can further comprise, at 910, applying a second charge to the second electrode, while grounding the first electrode, wherein the applying the first charge and the applying the second charge can be in a manner that results in a plurality of resistance states. The first charge and the second charge can be of the same polarity (e.g., both of a positive polarity, or, in some embodiments, both of a negative polarity). Further, the first voltage can have a first amplitude, and the second voltage can have a second amplitude, wherein the first amplitude can be different from the second amplitude. The phase change memory material can comprise germanium-antimony-tellurium (GST). The metallic liner can comprise any metal, and can also comprise a metal nitride. The semiconductor structure can comprise a dielectric material (e.g., dielectric layer 310) from which a pore (e.g., pore 305) was formed, wherein the phase change memory material and the metallic liner are confined within the pore.

The performing the bipolar switching produces a plurality of resistance states. The semiconductor structure can be a first semiconductor structure, the phase change memory material can be a first phase change memory material, and the plurality of resistance states can be a first plurality of resistance states. A first resistance drift associated with one of the first plurality of resistance states is less than a second resistance drift associated with a second plurality of resistance states associated with a second semiconductor structure having a second phase change memory material without the metallic liner (e.g., the second semiconductor structure can be as depicted in FIG. 1). This was also illustrated with respect to FIG. 5. Additionally, a first drift coefficient associated with one of the first plurality of resistance states is less than a second drift coefficient associated a second plurality of resistance states associated with the second semiconductor structure (also illustrated with respect to FIG. 5).

Figure 10:
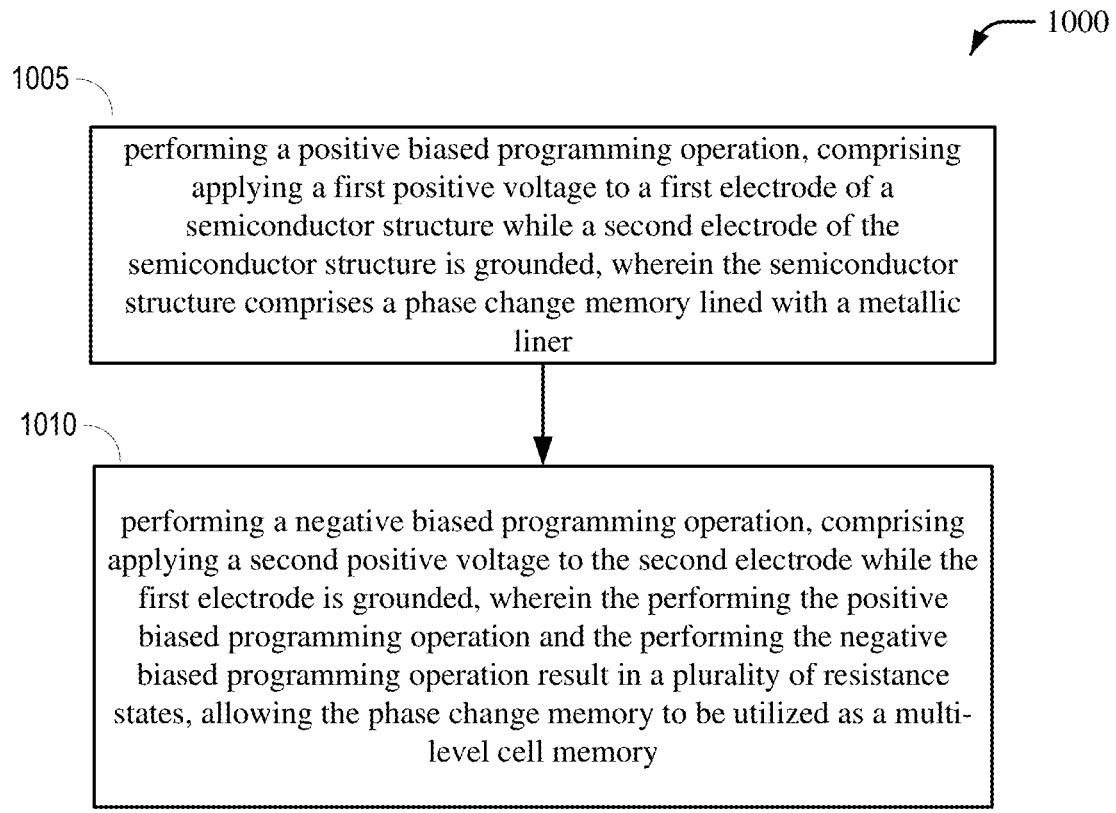
FIG. 10 illustrates a flow diagram of another example, non-limiting method to perform a bipolar switching of semiconductor structure having a phase change memory with a metallic liner in accordance with one or more embodiments described herein.

Moving on to FIG. 10, another flow diagram 1000 depicts an example non-limiting method (e.g., operations) to perform bipolar switching in accordance with one or more embodiments described herein. The method at 1005 comprises, performing a positive biased programming operation, comprising applying a first voltage to a first electrode (e.g., top electrode 335) of a semiconductor structure while a second electrode (e.g., bottom electrode 315) of the semiconductor structure is grounded, wherein the semiconductor structure comprises a phase change memory (e.g., phase change memory 325) lined with a metallic liner (e.g., metallic liner 320). The method at 1010 further comprises, performing a negative biased programming operation, comprising applying a second voltage to the second electrode while the first electrode is grounded. The performing the positive biased programming operation and the performing the negative biased programming operation can be in a manner so as to result in a plurality of resistance states, allowing the phase change memory to be utilized as a multi-level cell memory. The negative biased programming results in a first reset resistance that is between a set resistance and a second reset resistance of the positive-bias programming operation. The phase change memory material can comprise any type of material suitable for phase change memory, including germanium-antimony-tellurium (GST). The metallic liner can comprise any metal, and can also comprise a metal nitride. The first voltage and the second voltage can be of the same polarity (e.g., both of positive polarity, or, in some embodiments, both of a negative polarity). Further, the first voltage can have a first amplitude, and the second voltage can have a second amplitude, wherein the first amplitude can be different from the second amplitude.

As mentioned, the performing the bipolar switching method depicted in flow diagram 1000 produces a plurality of resistance states. The semiconductor structure can be a first semiconductor structure, the phase change memory can be a first phase change memory, and the plurality of resistance states can be a first plurality of resistance states. A first resistance drift associated with one of the first plurality of resistance states is less than a second resistance drift associated with a second plurality of resistance states associated with a second semiconductor structure having a second phase change memory without the metallic liner (e.g., the second semiconductor structure can be as depicted in FIG. 1). This was also illustrated with respect to FIG. 5. Additionally, a first drift coefficient associated with one of the first plurality of resistance states is less than a second drift coefficient associated a second plurality of resistance states associated with the second semiconductor structure (also illustrated with respect to FIG. 5).

Figure 11:
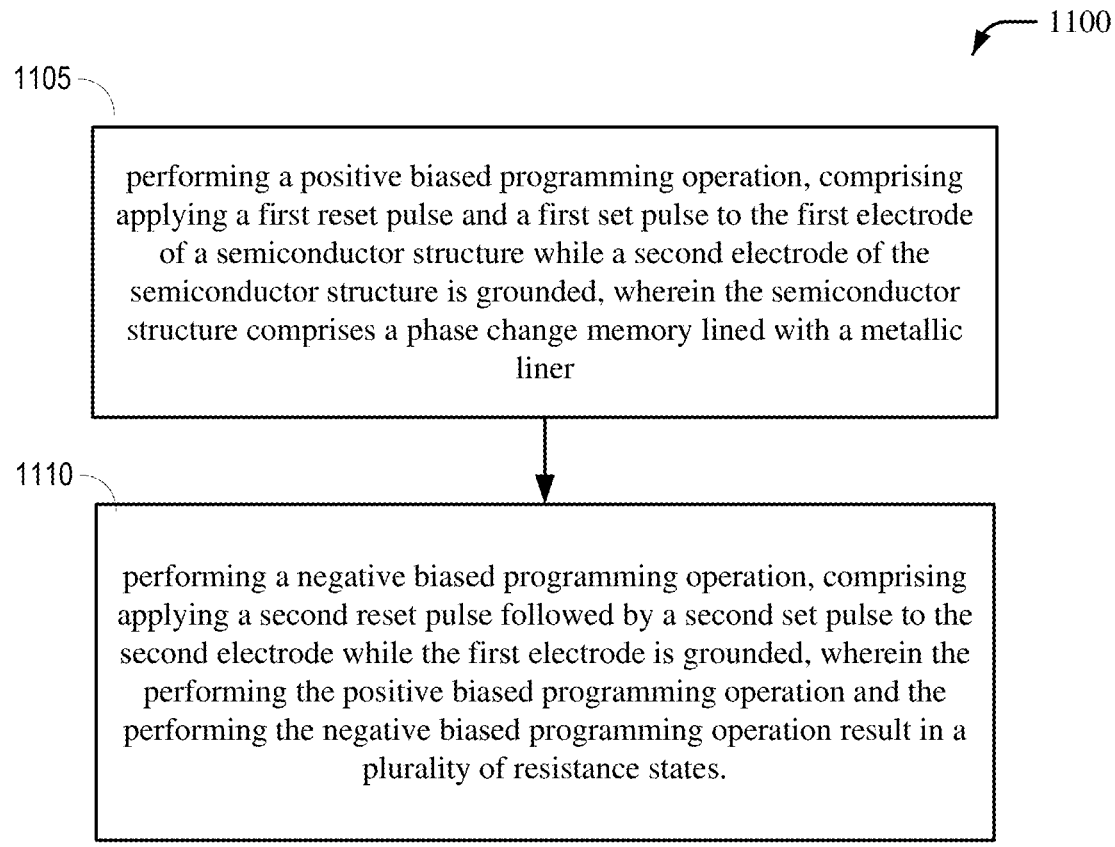
FIG. 11 illustrates a flow diagram of another example, non-limiting method to perform a bipolar switching of semiconductor structure having a phase change memory with a metallic liner in accordance with one or more embodiments described herein.

Referring now to FIG. 11, another flow diagram 1100 depicts an example non-limiting method (e.g., operations) to perform bipolar switching in accordance with one or more embodiments described herein. The method can comprise, at 1105, performing a positive biased programming operation, comprising applying a first reset pulse and a first set pulse to the first electrode (e.g., top electrode 335) of a semiconductor structure while a second electrode (e.g., bottom electrode 315) of the semiconductor structure is grounded, wherein the semiconductor structure comprises a phase change memory (e.g., phase change memory 325) lined with a metallic liner (e.g., metallic liner 320). The first reset pulse and the first set pulse can both be of a positive charge. The magnitude of the first reset pulse can be greater than that of the first set pulse, and the duration of the first reset pulse can be shorter than the duration of the first set pulse, with a resting period of no charge between each pulse. This is also shown in FIG. 6. The method at 1110 can further comprise, performing a negative biased programming operation, comprising applying a second reset pulse followed by a second set pulse to the second electrode while the first electrode is grounded. The second reset pulse and the second set pulse can both be of a positive charge. The magnitude of the second reset pulse can be greater than that of the second set pulse, and the duration of the second reset pulse can be shorter than the duration of the second set pulse, with a resting period of no charge between each pulse. This is also shown in FIG. 7. The phase change memory can be comprised of any type of material that can be used as phase change memory (e.g., can comprise germanium-antimony-tellurium), and the metallic liner can comprise any metal, or can comprise a metal nitride. The semiconductor structure can comprise a dielectric material (e.g., dielectric layer 310) from which a pore (e.g., pore 305) was formed, wherein the pore confines the phase change memory material and the metallic liner. The performing the positive biased programming operation and the performing the negative biased programming operation result in a plurality of resistance states, enable the phase change memory to be suitable for utilization as a multi-level cell (MLC) memory.

The voltage applied for positive-biased programming and negative-biased programming can be of the same polarity (for example, for positive-biased programming, a positive voltage can be applied to the top electrode while the bottom electrode is grounded, and for negative-biased programming, a positive voltage can be applied to the bottom electrode while the top electrode is grounded). The applied voltages can also vary in amplitude.

The magnitude of the first reset pulse can be greater than that of the first set pulse, and the duration of the first reset pulse can be shorter than the duration of the first set pulse, with a resting period of no charge between each pulse. This is also shown in FIG. 6.

The magnitude of the second reset pulse can be greater than that of the second set pulse, and the duration of the second reset pulse can be shorter than the duration of the second set pulse, with a resting period of no charge between each pulse. This is also shown in FIG. 7.

As mentioned, the performing the bipolar switching produces a plurality of resistance states. The semiconductor structure can be a first semiconductor structure, the phase change memory can be a first phase change memory, and the plurality of resistance states can be a first plurality of resistance states. A first resistance drift associated with one of the first plurality of resistance states is less than a second resistance drift associated with a second plurality of resistance states associated with a second semiconductor structure having a second phase change memory without the metallic liner (e.g., the second semiconductor structure can be as depicted in FIG. 1). This was also illustrated with respect to FIG. 5. Additionally, a first drift coefficient associated with one of the first plurality of resistance states is less than a second drift coefficient associated with the second plurality of resistance states (also illustrated with respect to FIG. 5).

Figure 12:
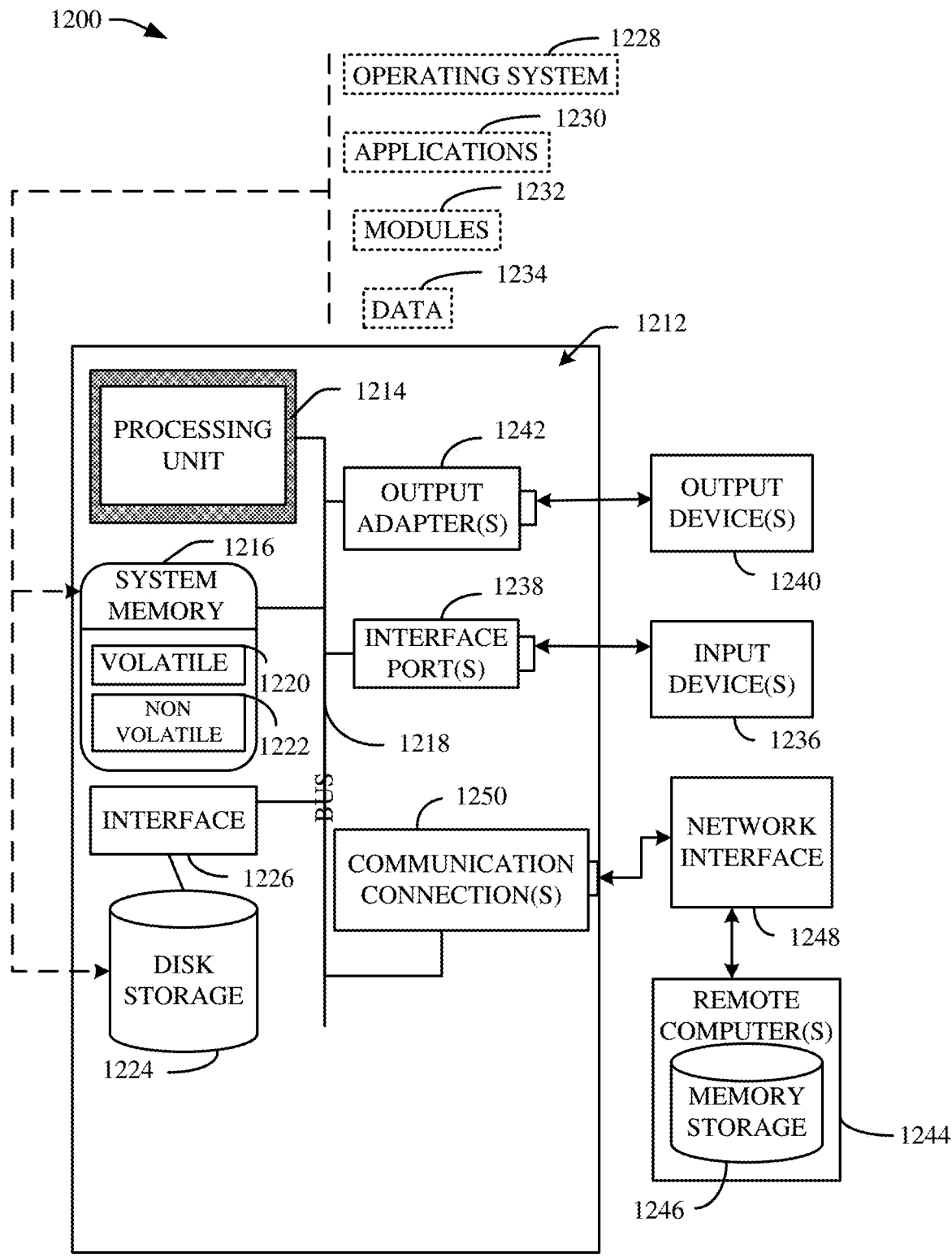
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity.

With reference to FIG. 12, a suitable operating environment 1200 for implementing various aspects of this invention can also include a computer 1212. The computer 1212 can also include a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1216 can also include volatile memory 1220 and nonvolatile memory 1222. The basic input/output system (BIOS), containing the basic routines to transfer information between elements within the computer 1212, such as during start-up, is stored in nonvolatile memory 1222. Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media. To facilitate connection of the disk storage 1224 to the system bus 1218, a removable or non-removable interface is typically used, such as interface 1226. FIG. 12 also depicts software that acts as an intermediary between users and the basic computer resources described in the suitable operating environment 1200. Such software can also include, for example, an operating system 1228. Operating system 1228, which can be stored on disk storage 1224, acts to control and allocate resources of the computer 1212.

System applications 1230 take advantage of the management of resources by operating system 1228 through program modules 1232 and program data 1234, e.g., stored either in system memory 1216 or on disk storage 1224. It is to be appreciated that this invention can be implemented with various operating systems or combinations of operating systems. A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port can be used to provide input to computer 1212, and to output information from computer 1212 to an output device 1240. Output adapter 1242 is provided to illustrate that an output device 1240, like a monitor, speaker, and printer, among other output devices, might require special adapters. The output adapter 1242 can include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this invention also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this invention can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this invention, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this invention, but one of ordinary skill in the art can recognize that many further combinations and permutations of this invention are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this invention, but one of ordinary skill in the art can recognize that many further combinations and permutations of this invention are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:

1. A method, comprising:
applying a first voltage to a first electrode of a semiconductor structure comprising a phase change memory having a metallic liner contacting the phase change memory while a second electrode of the semiconductor structure is grounded, wherein the phase change memory and the metallic liner are located between the first electrode and the second electrode, and the metallic liner is a liner directly connected between the phase change memory and a dielectric material;
applying a second voltage to the second electrode while the first electrode is grounded; and
producing a plurality of resistance states by the applying the first voltage and the applying the second voltage, wherein a first drift coefficient associated with a first set of the plurality of resistance states associated with the semiconductor structure having the phase change memory with the metallic liner is less than a second drift coefficient associated with a second set of the plurality of resistance states associated with a second semiconductor structure having a second phase change memory without the metallic liner based on the metallic liner providing an alternative conductive path if a condition exists in which a direct current path across the phase change memory is blocked.

2. The method of claim 1, wherein the applying the first voltage and the applying the second voltage comprise applying a first voltage having a first polarity that is the same as a second polarity of the second voltage.

3. The method of claim 2, wherein the polarity comprises a positive polarity.

4. The method of claim 1, wherein a first amplitude of the first voltage differs from a second amplitude of the second voltage.

5. The method of claim 1, wherein the applying the first voltage to the first electrode of the semiconductor structure comprising a phase change memory comprises applying the first voltage to the first electrode of the semiconductor structure comprising a phase change memory including germanium-antimony-tellurium.

6. The method of claim 1, wherein the applying the first voltage to the first electrode of the semiconductor structure comprising a phase change memory having the metallic liner comprises applying the first voltage to the first electrode of the semiconductor structure comprising the phase change memory having the metallic liner comprising metal nitride.

7. The method of claim 1, wherein the applying the first voltage to the first electrode of the semiconductor structure comprising a phase change memory comprises having the metallic liner contacting the phase change memory while the second electrode of the semiconductor structure is grounded comprises applying the first voltage to the first electrode of the semiconductor structure comprising a phase change memory comprises having the metallic liner contacting the phase change memory while the second electrode of the semiconductor structure comprising the dielectric material that surrounds the metallic liner is grounded.

8. The method of claim 1, wherein a first resistance drift associated with a first set of the plurality of resistance states having the semiconductor structure having the phase change memory with the metallic liner is less than a second resistance drift associated a second set of the plurality of resistance states associated with a second semiconductor structure having a second phase change memory without the metallic liner.

9. A method, comprising:
applying a first charge to a first electrode of a semiconductor structure while grounding a second electrode of the semiconductor structure comprising a phase change memory material with a metallic liner, wherein the metallic liner is a liner between the phase change memory and a dielectric material; and
applying a second charge to the second electrode, while grounding the first electrode, wherein the applying the first charge and the applying the second charge result in a plurality of resistance states, wherein a first resistance drift associated with a first set of the plurality of resistance states having the semiconductor structure having the phase change memory with the metallic liner is less than a second resistance drift associated a second set of the plurality of resistance states associated with a second semiconductor structure having a second phase change memory without the metallic liner.

10. The method of claim 9, wherein the applying the first charge to the first electrode of the semiconductor structure while grounding the second electrode of the semiconductor structure comprising a phase change memory material with a metallic liner comprises applying the first charge to the first electrode of the semiconductor structure while grounding the second electrode of the semiconductor structure comprising a phase change memory material that comprises germanium-antimony-tellurium and having a metallic liner.

11. The method of claim 9, wherein the applying the first charge to the first electrode of the semiconductor structure while grounding the second electrode of the semiconductor structure comprising a phase change memory material with a metallic liner comprises applying the first charge to the first electrode of the semiconductor structure while grounding the second electrode of the semiconductor structure comprising a phase change memory material having a metallic liner comprising metal nitride.

12. The method of claim 9, further comprising:
forming, in the semiconductor structure, a pore comprised of the dielectric material, wherein the phase change memory material and the metallic liner are confined within the pore.

13. The method of claim 9, wherein the first charge and the second charge are of the same polarity.

14. The method of claim 13, wherein the polarity comprises a positive polarity.

15. The method of claim 9, wherein a first amplitude of the first charge differs from a second amplitude of the second charge.

16. A method, comprising:
performing a positive biased programming operation, comprising applying a first positive voltage to a first electrode of a semiconductor structure while a second electrode of the semiconductor structure is grounded, wherein the semiconductor structure comprises a phase change memory lined with a metallic liner, and the metallic liner is a liner between the phase change memory and a dielectric material; and
performing a negative biased programming operation, comprising applying a second positive voltage to the second electrode while the first electrode is grounded, wherein the performing the positive biased programming operation and the performing the negative biased programming operation result in a plurality of resistance states allows the phase change memory to be utilized as a multi-level cell memory, wherein a first drift coefficient associated with a first set of the plurality of resistance states associated with the semiconductor structure having the phase change memory with the metallic liner is less than a second drift coefficient associated with a second set of the plurality of resistance states associated with a second semiconductor structure having a second phase change memory without the metallic liner.

17. The method of claim 16, wherein the plurality of resistance states comprises a first reset resistance that is between a set resistance and a second reset resistance associated with the performing the positive biased programming operation.

18. The method of claim 16, wherein the applying a first positive voltage to a first electrode of a semiconductor structure while a second electrode of the semiconductor structure is grounded, wherein the semiconductor structure comprises the phase change memory having germanium-antimony-tellurium and a metallic liner.

19. The method of claim 16, wherein the applying a first positive voltage to a first electrode of a semiconductor structure while a second electrode of the semiconductor structure is grounded, wherein the semiconductor structure comprises the phase change memory having germanium-antimony-tellurium and a metallic liner composed of metal nitride.

* * * * *